(12) United States Patent
Kameyama et al.

(10) Patent No.: US 7,746,424 B2
(45) Date of Patent: Jun. 29, 2010

(54) HIGH LUMINANCE POLARIZING PLATE, AND LIQUID CRYSTAL PANEL AND IMAGE DISPLAY USING SAME

(75) Inventors: Tadayuki Kameyama, Ibaraki (JP); Naoki Takahashi, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 1171 days.

(21) Appl. No.: 10/548,085

(22) PCT Filed: Mar. 1, 2004

(86) PCT No.: PCT/JP2004/002462

§ 371 (c)(1),
(2), (4) Date: Sep. 6, 2005

(87) PCT Pub. No.: WO2004/079414

PCT Pub. Date: Sep. 16, 2004

(65) Prior Publication Data

US 2006/0181662 A1      Aug. 17, 2006

(30) Foreign Application Priority Data

Mar. 7, 2003     (JP) .............................. 2003-061766

(51) Int. Cl.
   *G02F 1/1335* (2006.01)
(52) U.S. Cl. .................... 349/96; 349/117; 349/118
(58) Field of Classification Search .................. None
   See application file for complete search history.

(56) References Cited

U.S. PATENT DOCUMENTS 5,825,543 A * 10/1998 Ouderkirk et al. ........... 359/494
6,088,079 A      7/2000 Kameyama et al.
6,288,840 B1 * 9/2001 Perkins et al. .............. 359/486
6,361,838 B1   3/2002 Miyatake et al.
6,433,853 B1   8/2002 Kameyama et al.

(Continued)

FOREIGN PATENT DOCUMENTS

CN      1380576      11/2002

(Continued)

OTHER PUBLICATIONS

Machine translation of JP2002-328233A.*

(Continued)

*Primary Examiner*—David Nelms
*Assistant Examiner*—W. Patty Chen
(74) *Attorney, Agent, or Firm*—Westerman, Hattori, Daniels & Adrian, LLP

(57) ABSTRACT

A high-brightness polarizing plate of the present invention comprises a polarizing plate that comprises a polarizer and a protective film prepared on one or both sides of the polarizer, a brightness enhancement film and an adhesive layer through which the polarizing plate and the brightness enhancement film are laminated with the protective film interposed between them, wherein the protective film has an in-plane retardation Re of 0 to 10 nm and a thickness-direction retardation Rth of −30 to 10 nm, wherein Re=(nx−ny)d and Rth={(nx+ny)/(2−nz)}d. The high-brightness polarizing plate has a small color shift, and can be applied to various image displays such as liquid crystal displays.

13 Claims, 1 Drawing Sheet

U.S. PATENT DOCUMENTS

| | | | |
|---|---|---|---|
| 6,657,690 B2 * | 12/2003 | Hashimoto | 349/117 |
| 6,961,178 B2 | 11/2005 | Sugino et al. | |
| 2002/0015120 A1 * | 2/2002 | Kameyama et al. | 349/95 |
| 2003/0189754 A1 * | 10/2003 | Sugino et al. | 359/485 |
| 2003/0210370 A1 * | 11/2003 | Yano et al. | 349/117 |

FOREIGN PATENT DOCUMENTS

| | | | |
|---|---|---|---|
| JP | 9-507308 | | 7/1997 |
| JP | 11-64840 | | 3/1999 |
| JP | 11-64841 | | 3/1999 |
| JP | 11-248941 | | 9/1999 |
| JP | 11-248942 | | 9/1999 |
| JP | 2001343529 A | * | 12/2001 |
| JP | 2002-303725 | | 10/2002 |
| JP | 2002-328233 | | 11/2002 |
| KR | 2001-6612 A | | 1/2001 |
| WO | WO 95/17691 | | 6/1995 |

OTHER PUBLICATIONS

Translation of the International Preliminary Report on Patentability of International Application No. PCT/JP 2004/002462, with Form PCT/IB/338.

"Kogakuyo Tomei Jushi", Kabushiki Kaisha Gijutsu Joho Kyokai, Dec. 17, 2001, pp. 147-153.

Decision of Refusal dated Feb. 16, 2009 issued in corresponding Japanese No. Patent Application No. 2003-061766.

Author "Unknown"; "Transparent Resin Material for Optical Use"; Published Dec. 17, 2001; "Technical Information Institute Co., Ltd.".

Korean Office Action issued on May 22, 2009 for corresponding Korean Patent Application No. 10-2005-7014792.

* cited by examiner

HIGH LUMINANCE POLARIZING PLATE, AND LIQUID CRYSTAL PANEL AND IMAGE DISPLAY USING SAME

TECHNICAL FIELD

The invention relates to a high-brightness polarizing plate comprising a laminate of a polarizing plate and a brightness enhancement film. The high-brightness polarizing plate of the invention may be used alone or in combination with any other optical film to form various types of image viewing displays such as liquid displays, organic electro-luminescent(EL) displays and plasma display panels (PDPs).

BACKGROUND ART

In a conventional technique, natural light emitted from a backlight enters liquid crystal cells as it is. Recently, upsizing and high definition of liquid crystal displays have required an increase in backlight brightness. In addition, a number of techniques are beginning to be used for polarization of light from backlights.

In a backside of a liquid crystal cell, for example, the high-brightness polarizing plate with which a polarizing plate and a brightness enhancement film are adhered together is prepared. A brightness enhancement film shows a characteristic that reflects linearly polarized light with a predetermined polarization axis, or circularly polarized light with a predetermined direction, and that transmits other light, when natural light by back lights of a liquid crystal display or by reflection from a back-side etc., comes in. The polarizing plate, which is obtained by laminating a brightness enhancement film to a polarizing plate, thus does not transmit light without the predetermined polarization state and reflects it, while obtaining transmitted light with the predetermined polarization state by accepting a light from light sources, such as a backlight. This polarizing plate makes the light reflected by the brightness enhancement film further reversed through the reflective layer prepared in the backside and forces the light re-enter into the brightness enhancement film, and increases the quantity of the transmitted light through the brightness enhancement film by transmitting a part or all of the light as light with the predetermined polarization state. The polarizing plate simultaneously supplies polarized light that is difficult to be absorbed in a polarizer, and increases the quantity of the light usable for a liquid crystal picture display etc., and as a result luminosity may be improved. That is, in the case where the light enters through a polarizer from backside of a liquid crystal cell by the back light etc. without using a brightness enhancement film, most of the light, with a polarization direction different from the polarization axis of a polarizer, is absorbed by the polarizer, and does not transmit through the polarizer. This means that although influenced with the characteristics of the polarizer used, about 50 percent of light is absorbed by the polarizer, the quantity of the light usable for a liquid crystal picture display etc. decreases so much, and a resulting picture displayed becomes dark. A brightness enhancement film does not enter the light with the polarizing direction absorbed by the polarizer into the polarizer but reflects the light once by the brightness enhancement film, and further makes the light reversed through the reflective layer etc. prepared in the backside to re-enter the light into the brightness enhancement film. By this above-mentioned repeated operation, only when the polarization direction of the light reflected and reversed between the both becomes to have the polarization direction which may pass a polarizer, the brightness enhancement film transmits the light to supply it to the polarizer. As a result, the light from a backlight may be efficiently used for the display of the picture of a liquid crystal display to obtain a bright screen.

The suitable films are used as the above-mentioned brightness enhancement film. Namely, multilayer thin film of a dielectric substance; a laminated film that has the characteristics of transmitting a linearly polarized light with a predetermined polarizing axis, and of reflecting other light, such as the multilayer laminated film of the thin film having a different refractive-index anisotropy; an aligned film of cholesteric liquid-crystal polymer; a film that has the characteristics of reflecting a circularly polarized light with either left-handed or right-handed rotation and transmitting other light, such as a film on which the aligned cholesteric liquid crystal layer is supported etc. may be mentioned.

Therefore, in the brightness enhancement film of a type that transmits a linearly polarized light having the above-mentioned predetermined polarization axis, by arranging the polarization axis of the transmitted light and entering the light into a polarizing plate as it is, the absorption loss by the polarizing plate is controlled and the polarized light can be transmitted efficiently. On the other hand, in the brightness enhancement film of a type that transmits a circularly polarized light as a cholesteric liquid-crystal layer, the light may be entered into a polarizer as it is, but it is desirable to enter the light into a polarizer after changing the circularly polarized light to a linearly polarized light through a retardation plate, taking control an absorption loss into consideration. In addition, a circularly polarized light is convertible into a linearly polarized light using a quarter wavelength plate as the retardation plate.

If the light guide plate itself has a prism structure and a prism-type condensing sheet or the like is used together, polarized light can be emitted from a backlight, through it is slight. In such a case, the polarization performance can be 5% or more, preferably 10% or more, further preferably 15% or more, and a direction of the emitted light does not have to be in the normal direction of the backlight face. The polarization performance is represented by the formula: polarization performance=(maximum brightness−minimum brightness)/(maximum brightness+minimum brightness). The polarization performance is determined by measuring, through a Glan-Thomson prism, changes in brightness (maximum brightness and minimum brightness) of the emitted light from the backlight in the direction of the polarization axis.

In the case that such brightness enhancement films are used, there has been a problem of the amount of color shift. A various kinds of methods have been proposed to reduce the amount of color shift (for example, see Japanese Patent Application Laid-Open (JP-A) Nos. 11-248941, 11-248942, 11-64840, and 11-64841). In these literatures, a reduction in the amount of color shift in the whole of a liquid crystal display is investigated. In JP-A Nos. 11-248941 and 11-248942, a reduction in the amount of color shift of a brightness enhancement film is investigated. In JP-A Nos. 11-64840 and 11-64841, a combination of a brightness enhancement film and a liquid crystal panel is investigated to reduce the amount of color shift. Conventionally, however, the amount of color shift is not sufficiently reduced in the high-brightness polarizing plate that is a laminate of a polarizing plate and a brightness enhancement film.

It is also known that a composite film of an interference multilayer laminate and a stretched polyvinyl alcohol-based film is impregnated with iodine to form a high-brightness polarizing plate of a composite of a brightness enhancement film and a polarizer (for example, see Japanese Patent Application National Publication (Laid-Open) No. 09-507308, page 12). Such the high-brightness polarizing plate can reduce the amount of color shift to some extent but can have serious unevenness in dyeing of the polarizer, therefore it cannot be applied to image viewing displays such as liquid crystal displays. The polyvinyl alcohol-based film is stretched to 3 times or more (4 times or more or 5 times or more) and controlled to have a water content of 10% or less. In the process of impregnating the resulting film with iodine, the speed of iodine dyeing can vary with variations in the alignment state of the polyvinyl alcohol-based film in the width and variations in the thickness directions and variations in the degree of crystallinity in the width direction, so that thick parts can significantly tend to be deeply dyed and thin parts less deeply dyed. Thus, uneven dyeing can occur in the polarizer, and in-plane unevenness can lead to an insufficient reduction in brightness when black viewing is displayed. It is practically difficult to apply such a composite film to liquid crystal displays or the like.

DISCLOSURE OF INVENTION

It is an object of the invention to provide a high-brightness polarizing plate comprising of a polarizing plate and a brightness enhancement film, and to suppress color shift in reduced amount.

It is another object of the invention to provide a liquid crystal panel using such a high-brightness polarizing plate and to provide image viewing displays such as liquid crystal displays using such a high-brightness polarizing plate.

The inventors have made active investigations to solve the above problems and finally have found that the high-brightness polarizing plate as described below can fulfill the above objects, thereby completing the invention. Thus, the invention is as follows:

1. A high-brightness polarizing plate, comprising: a polarizing plate that comprises a polarizer and a protective film prepared on one or both sides of the polarizer; a brightness enhancement film; and an adhesive layer through which the polarizing plate and the brightness enhancement film are laminated with the protective film interposed between them, wherein the protective film has an in-plane retardation Re of 0 to 10 nm and a thickness-direction retardation Rth of −30 to 10 nm, wherein $Re=(nx-ny)d$ and $Rth=\{(nx+ny)/(2-nz)\}d$, wherein nx is a refractive index in an X-axis direction in which a maximum in-plane refractive index is obtained, ny is a refractive index in an Y-axis direction perpendicular to the X-axis, nz is a refractive index in a Z-axis direction which is the film thickness direction, and d is an thickness (nm) of the protective film.

2. The high-brightness polarizing plate described above 1, wherein the protective film contains (A) a thermoplastic resin having a substituted and/or unsubstituted imide group in side chain and (B) a thermoplastic resin having a substituted and/or unsubstituted phenyl and nitrile groups in side chain.

3. The high-brightness polarizing plate described above 1 or 2, wherein the protective film is a biaxially stretched film.

4. The high-brightness polarizing plate described above 1 to 3, wherein the polarizer is an iodine-containing polyvinyl alcohol-based film.

5. The high-brightness polarizing plate described above 1 to 4, wherein the brightness enhancement film is an anisotropic reflection polarizer.

6. The high-brightness polarizing plate described above 5, wherein the anisotropic reflection polarizer is a composite of a cholesteric liquid crystal layer and a quarter wavelength plate.

7. The high-brightness polarizing plate described above 5, wherein the anisotropic reflection polarizer is an anisotropic multilayered thin film capable of transmitting linearly polarized light in one direction of vibration and reflecting linearly polarized light that in another direction of vibration.

8. The high-brightness polarizing plate described above 5, wherein the anisotropic reflection polarizer is a reflective grid polarizer.

9. The high-brightness polarizing plate described above 1 to 4, wherein the brightness enhancement film is an anisotropic scattering polarizer.

10. A high-brightness polarizing plate, comprising the high-brightness polarizing plate described above 1 to 9 and at least one optical film.

11. A liquid crystal panel, comprising a liquid crystal cell and the high-brightness polarizing plate described above 1 to 10 attached to at least one side of the liquid crystal cell.

12. A liquid crystal display, comprising the liquid crystal panel described above 11.

13. An image viewing display, comprising the high-brightness polarizing plate described above 1 to 10.

Effects and Advantages

In the high-brightness polarizing plate comprising a laminate of a polarizing plate and a brightness enhancement film, transmitted light from the brightness enhancement film is converted to substantially linearly polarized light, which enters the polarizing plate. In this case, the direction of the polarization axis of the brightness enhancement film is set substantially parallel to the direction of the transmission axis of the polarizing plate.

The polarizing plate to be used generally comprises a polarizer and a protective film provided thereon. The protective film used has an in-plane retardation Re of approximately 0 nm such that the linearly polarized light from the brightness enhancement film can transmit the protective film as it is. Although protective films conventionally used have an in-plane retardation Re of approximately 0 nm, they have retardation in the thickness direction. For example, a 80 μm-thick triacetyl cellulose film has a thickness-direction retardation of −60 nm, and a 40 μm-thick triacetyl cellulose film has a thickness-direction retardation of −35 nm. Protective films having in-plane birefringence properties are sometimes used. When such protective films are used, the direction of the polarization axis of the brightness enhancement film is often set parallel or perpendicular to the direction of the transmission axis of the polarizing plate. The inventors have found that a high-brightness polarizing plate comprising a laminate of the polarizing plate in which a protective film having retardation in the thickness direction is used and the brightness enhancement film can have a large amount of color shift.

The development of polarization in a polarizer may be calculated from the imaginary part values (ke,ko) of the birefringence index of a dichroic dye (such as iodine, an organic dye and a lyotropic liquid crystal).

$E=Eo\text{Exp}(ik\cdot z)$ $k=(ne+no)+i(ke+ko)$

Thus, if linearly polarized light enters perpendicular to the dichroic dye from any direction with the same light-intensity ratio in the front face direction at any wavelength in the visible light range, the amount of color shift can be reduced.

In a case where the optical axis of the protective film is perpendicular to the direction of ke of the dichroic dye, for example, in a case where the optical axis is in the thickness direction (Z-axis direction), ke axis is in arbitrary in-plane direction (in X-Y plane) or the optical axis is in the in-plane direction (X-axis direction), ke axis is in the in-plane Y-axis direction or the optical axis is in the in-plane direction (X-axis direction), or ke axis is in the thickness direction (Z-axis direction), if the elevation angle is changed from the position inclined by 45° to the in-plane X or Y direction, the apparent perpendicular relationship can be altered. Thus, it is desirable that the linearly polarized light derived from the brightness enhancement film should not be converted into omni directional elliptically-polarized light. Therefore, it is desirable that ke axis is parallel to the optical axis of the protective film, or it is not affected by the retardation even if ke axis is perpendicular to the optical axis of the protective film.

Under the circumstances, the inventors have employed a protective film with an in-plane retardation Re of approximately 0 nm, that is 10 nm or less, and a thickness-direction retardation Rth of −30 to 10 nm, to be interposed between the polarizing plate and the brightness enhancement film. Such a protective film does not affect the linearly polarized light from the brightness enhancement film and thus can reduce the visual amount of color shift when white viewing is displayed on a liquid crystal display or the like. In a preferred mode, the in-plane retardation Re is approximately 0 nm, specifically 10 nm or less, more preferably 5 nm or less. The thickness-direction retardation Rth is preferably from −10 to 10 nm, more preferably from −5 to 5 nm, still more preferably from −3 to 3 nm.

In the high-brightness polarizing plate of the invention, the polarizing plate and the brightness enhancement film are adhered together with an adhesive. In the case that a polarizing plate and a brightness enhancement film are used, the optical properties are generally affected by whether or not an air interface is interposed between them. In general, the brightness enhancement rate increases by 1 to 3% when no air interface is interposed, relative to when an air interface is interposed. In such a case, however, the amount of color shift can be about 1 to 10% higher. The optical properties also depend on the backlight system to be used. According to the invention, the above-defined protective film interposed between the polarizer and the brightness enhancement film is used, and reflection at the interface is prevented by the adhesive layer, so that an improvement in brightness during white viewing display and a reduction in the amount of color shift can be achieved at the same time.

When the brightness enhancement film comprises an anisotropic reflection polarizer of a composite of a cholesteric liquid crystal layer and a quarter wavelength plate, only about 90% of the circularly polarized component from the cholesteric liquid crystal layer can be converted by the quarter wavelength plate. Thus, it is preferred that the thickness-direction retardation Rth of the protective film should be a slightly positive value. If the design of the quarter wavelength plate is further modified, the thickness-direction retardation Rth of the protective film can be modified.

The high-brightness polarizing plate of the invention comprises a laminate of a brightness enhancement film and a polarizing plate that comprises a polarizer and a protective film provided on one or both sides of the polarizer. In general, the polarizer of the polarizing plate according to the invention may be a product prepared by a conventional technique including the steps of subjecting a polyvinyl alcohol-based film or the like to swelling, dyeing, crosslinking, stretching, water-washing, and the like as needed. In contrast to the composite high-brightness polarizing plate as disclosed in Japanese Patent Application National Publication (Laid-Open) No. 09-507308, therefore, the high-brightness polarizing plate according to the invention can be prevented from causing in-plane unevenness, which would otherwise be caused by uneven dyeing of the polarizer, and have low brightness when black viewing is displayed on a liquid display or the like.

Figure 1:
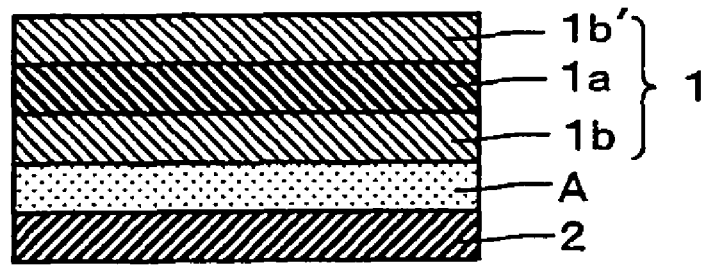
FIG. 1 is a cross-sectional view of an example of the high-brightness polarizing plate according to the invention.

In the drawings, reference numerals 1 and 1' represent polarizing plate, 1a represent polarizer, 1b and 1b' represent protective film, 2 represent brightness enhancement film, 2a represent quarter wavelength plate, 2b represent cholesteric liquid crystal layer, (A) represent adhesive layer, (B) represent backlight, (C) represent liquid crystal cell, (D) a diffusing plate, and (E) a reflective plate, respectively.

BEST MODE FOR CARRYING OUT THE INVENTION

Figure 2:
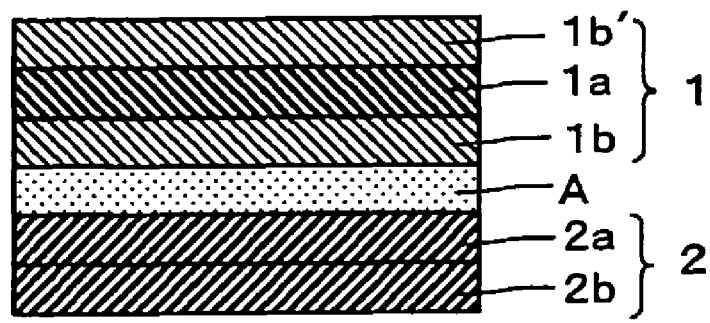
FIG. 2 is a cross-sectional view of another example of the high-brightness polarizing plate according to the invention.

The invention is described below with reference to the drawings. FIG. 1 is a cross-sectional view of a high-brightness polarizing plate in which a polarizing plate (1) comprising a polarizer (1a), a protective film (1b) prepared on one side thereof and another protective film (1b') prepared on the other side thereof is laminated with a brightness enhancement film (2) via an adhesive layer (A) with the protective film (1b) interposed between them. The protective film (1b) has an in-plane retardation Re of 10 nm or less and a thickness-direction retardation Rth of −30 to 10 nm. FIG. 2 shows a case where a brightness enhancement film (2) is a composite of a cholesteric liquid crystal layer (2b) and a quarter wavelength plate (2a). In this composite, the quarter wavelength plate (2a) is placed on the polarizing plate (1) side.

Figure 3:
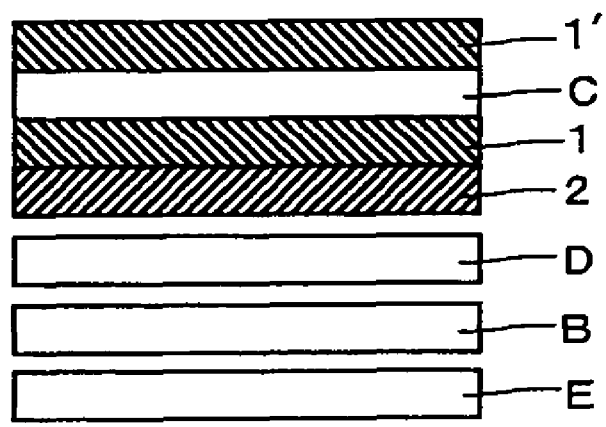
FIG. 3 is a cross-sectional view of an example of the liquid crystal display according to the invention.

FIG. 3 is a cross-sectional view of a liquid crystal display comprising: a liquid crystal cell (C); a polarizing plate (1') provided on the emission side thereof; a high-brightness polarizing plate provided on the incidence side thereof, which comprises a polarizing plate (1) and a brightness enhancement film (2); a backlight (B); a diffusing plate (D); and a reflecting plate (E). In FIG. 3, the adhesive layer (A) is omitted. The polarizing plate (1') placed on the emission side may comprise a polarizer (1a) and a protective film(s) (1b') provided on one or both sides of the polarizer (1a). The protective film (1b') is not limited to that having an in-plane retardation Re and a thickness-direction retardation Rth in the same ranges, respectively, as the protective film (1b), though the protective film (1b') preferably has the same properties as the protective film (1b).

A polarizer(1a) is not limited especially but various kinds of polarizer may be used. As a polarizer, for example, a film that is uniaxially stretched after having dichromatic substances, such as iodine and dichromatic dye, absorbed to hydrophilic high molecular weight polymer films, such as polyvinyl alcohol type film, partially formalized polyvinyl alcohol type film, and ethylene-vinyl acetate copolymer type partially saponified film; poly-ene type orientation films, such as dehydrated polyvinyl alcohol and dehydrochlorinated polyvinyl chloride, etc. may be mentioned. In these, a polyvinyl alcohol type film on which dichromatic materials such as iodine, dye is absorbed and is aligned is suitably used. Although thickness of polarizer is not especially limited, the thickness of about 5 to 80 µm is commonly adopted.

A polarizer that is uniaxially stretched after a polyvinyl alcohol type film dyed with iodine is obtained by stretching a polyvinyl alcohol film by 3 to 7 times the original length, after dipped and dyed in aqueous solution of iodine. If needed the film may also be dipped in aqueous solutions, such as boric acid and potassium iodide. Furthermore, before dyeing, the polyvinyl alcohol type film may be dipped in water and rinsed if needed. By rinsing polyvinyl alcohol type film with water, effect of preventing un-uniformity, such as unevenness of dyeing, is expected by making polyvinyl alcohol type film swelled in addition that also soils and blocking inhibitors on the polyvinyl alcohol type film surface may be washed off. Stretching may be applied after dyed with iodine or may be applied concurrently, or conversely dyeing with iodine may be applied after stretching. Stretching is applicable in aqueous solutions, such as boric acid and potassium iodide, and in water bath.

During black viewing display, display unevenness or the like can be caused by uneven dyeing (variations in dyeing) of the polarizer with an iodine-containing material. For the purpose of avoiding such display unevenness or the like, it is preferred that a polyvinyl alcohol-based film or the like should be subjected to the respective steps of swelling, dyeing (in a dyeing bath that may contain potassium iodine or the like in addition to a dichroic dye such as iodine), crosslinking (in a crosslinking bath that may contain potassium iodine or the like in addition to a crosslinking agent such as boric acid), stretching (in a stretching bath that may contain boric acid, potassium iodide and the like), and water-washing.

Uneven dyeing can be caused by variations in the thickness of a polyvinyl alcohol raw film (JP-A Nos. 2000-216380 and 2002-31720). It can be prevented, or in general applications of the polarizing plate, display unevenness can hardly be observed even if a wide range (an in-plane range of 50 cm or more, preferably of 75 cm or more, further preferably of 100 cm or more) has thickness variations. During black viewing display, unevenness can be observed if visible brightness shade peak exist at a distance of 5 cm to 20 cm on the polarizer or the polarizing plate, but if beyond such a distance, significant display unevenness cannot be recognized. If it fluctuates at intervals of about 5 mm or less and if uneven iodine-dyeing, which is light and shade, exists, the brightness of black viewing can only averagely increase. The adsorption and alignment of iodine tends to depend on the thickness of the polyvinyl alcohol-based film, and the thicker, the more adsorption and the higher alignment.

In the method of producing a polarizer, a polyvinyl alcohol raw film with less variation in thickness is preferably used. If the raw film has a maximum thickness and a minimum thickness in a 100-400 mm in-plane area, the difference between them is 5 µm or less, preferably 3 µm or less, more preferably 1 µm or less. If the variation is greater than that, the film is preferably subjected to the steps of swelling in purified water or ion-exchanged water (at 15 to 40° C. for 50 to 180 seconds at a stretch ratio of 2 to 3.8), dyeing (in an aqueous solution of iodine and potassium iodide (1:6 to 1:50) for 10 to 60 seconds with a concentration of 0.05% to 3% (depending on the desired transmittance and the desired polarization degree and properties) at a stretch ratio of 1.2 to 2), crosslinking with boric acid (if the temperature is from 25 to 45° C., the stretch ratio is from 1.1 to 2, and the concentration of potassium iodide is from 0 to 5%), stretching (at a boric acid concentration of 2 to 8%, a potassium iodide concentration of 0 to 10%, a temperature of 30 to 65° C., and a stretch ratio of 1.7 to 3), and water-washing (at a potassium iodide concentration of 2 to 10%), in which the total stretch ratio is preferably from 5 to 6.5. If the width of the film is stretched to x times, the thickness and width of the film is preferably made $1/(x)^{1/2}$ times, respectively. The thickness may be 10% smaller than that and may be at most about 25% smaller than that. The width may be 10% wider than that and may be at most 25% wider than that. In a preferred mode, the stretched film is dried at 25 to 40° C. for 30 to 300 seconds such that its water content can be controlled to 12 to 28% (preferably 14 to 25%).

Materials forming a protective film (1b) are not limited, but preferably used are composition comprising (A) a thermoplastic resin having a substituted and/or non-substituted imide group in a side chain, and (B) a thermoplastic resin having a substituted and/or non-substituted phenyl group, and nitrile group in a side chain. A protective films comprising the thermoplastic resin (A) and (B) is hard to cause retardation, and control to make amount of in-plane retardation Re and thickness direction retardation Rth small even if the film was stretched. The protective films comprising the thermoplastic resin (A) and (B) are described in, for example, WO 01/37007. In addition, the protective film may also comprise other resins, when it comprises thermoplastic resins (A) and (B) as principal components.

The thermoplastic resin (A) may have substituted and/or non-substituted imide group in a side chain, and a principal chain may be of arbitrary thermoplastic resins. The principal chain may be, for example, of a principal chain consisting only of carbon atoms, or otherwise atoms other than carbon atoms may also be inserted between carbon atoms. And it may also comprise atoms other than carbon atoms. The principal chain is preferably of hydrocarbons or of substitution products thereof. The principal chain may be, for example, obtained by an addition polymerization. Among concrete examples are polyolefins and polyvinyls. And the principal chain may also be obtained by a condensation polymerization. It may be obtained by, for example, ester bonds, amide bonds, etc. The principal chain is preferably of polyvinyl skeletons obtained by polymerization of substituted vinyl monomers.

As methods for introducing substituted and/or non-substituted imide group into the thermoplastic resin (A), well-known conventional and arbitrary methods may be employed. As examples for those methods, there may be mentioned a method in which monomers having the above-mentioned imide group are polymerized, a method in which the above-mentioned imide group is introduced after a principal chain is formed by polymerization of various monomers, and a method in which compounds having the above-mentioned imide group is grafted to a side chain. As substituents for imide group, well-known conventional substituents that can substitute a hydrogen atom of the imide group may be used. For example, alkyl groups, etc. may be mentioned as examples.

The thermoplastic resin (A) is preferably of two or more component copolymers including a repeating unit induced from at least one kind of olefin, and a repeating unit having at least one kind of substituted and/or non-substituted maleimide structure. The above-mentioned olefin-maleimide copolymers may be synthesized from olefins and maleimide compounds using well-known methods. The synthetic process is described in, for example, Japanese Patent Laid-Open Publication No. H5-59193, Japanese Patent Laid-Open Publication No. H5-195801, Japanese Patent Laid-Open Publication No. H6-136058, and Japanese Patent Laid-Open Publication No. H9-328523 official gazettes.

As olefins, for example, there may be mentioned, isobutene, 2-methyl-1-butene, 2-methyl-1-pentene, 2-methyl-1-hexene, 2-methyl-1-heptene, 1-iso octene, 2-methyl-1-octene, 2-ethyl-1-pentene, 2-ethyl-2-butene, 2-methyl-2-pentene, and 2-methyl-2-hexene etc. Among them, isobutene is preferable. These olefins may be used independently and two or more kinds may be used in combination.

As maleimide compounds, there may be mentioned, maleimide, N-methyl maleimide, N-ethylmaleimide, N-n-propyl maleimide, N-i-propyl maleimide, N-n-butyl maleimide, N-s-butyl maleimide, N-t-butyl maleimide, N-n-pentyl maleimide, N-n-hexyl maleimide, N-n-heptyl maleimide, N-n-octyl maleimide, N-lauryl maleimide, N-stearyl maleimide, N-cyclo propyl maleimide, N-cyclobutyl maleimide, N-cyclopentyl maleimide, N-cyclohexyl maleimide, N-cycloheptyl maleimide, and N-cyclooctyl maleimide, etc. Among them N-methyl maleimide is preferable. These maleimide compounds may be used independently and two or more kinds may be used in combination.

A content of repeating units of olefin in the olefin-maleimide copolymer is not especially limited, and it is approximately 20 to 70 mole % in all of repeating units in the thermoplastic resin (A), preferably 40 to 60 mole %, and more preferably. 45 to 55 mole %. A content of repeating units of maleimide structure is approximately 30 to 80 mole %, preferably 40 to 60 mole %, and more preferably 45 to 55 mole %.

The thermoplastic resin (A) may comprise repeating units of the above-mentioned olefin, and repeating units of maleimide structure, and it may be formed only of these units. And in addition to the above constitution, other vinyl based monomeric repeating units may be included at a percentage of 50 mole % or less. As other vinyl based monomers, there may be mentioned, acrylic acid based monomers, such as methyl acrylate and butyl acrylate; methacrylic acid based monomers, such as methyl methacrylate and cyclo hexyl methacrylate; vinyl ester monomers, such as vinyl acetate; vinyl ether monomers, such as methyl vinyl ether; acid anhydrides, such as maleic anhydride; styrene based monomers, such as styrene, α-methyl styrene, and p-methoxy styrene etc.

A weight average molecular weight of the thermoplastic resin (A) is not especially limited, and it is approximately $1 \times 10^3$ to $5 \times 10^6$. The above-mentioned weight average molecular weight is preferably $1 \times 10^4$ or more and $5 \times 10^5$ or more. A glass transition temperature of the thermoplastic resin (A) is 80° C. or more, preferably 100° C. or more, and more preferably 130° C. or more.

And glutar imide based thermoplastic resins may be used as the thermoplastic resin (A). Glutar imide based resins are described in Japanese Patent Laid-Open Publication No. H2-153904 etc. Glutar imide based resins have glutar imide structural units and methyl acrylate or methyl methacrylate structural units. The above-mentioned other vinyl based monomers may be introduced also into the glutar imide based resins.

The thermoplastic resin (B) is a thermoplastic resin having substituted and/or non-substituted phenyl group, and nitrile group in a side chain. As a principal chain of the thermoplastic resin (B), similar principal chains as of the thermoplastic resin (A) may be illustrated.

As a method of introducing the above-mentioned phenyl group into the thermoplastic resin (B), for example, there may be mentioned a method in which monomers having the above-mentioned phenyl group is polymerized, a method in which phenyl group is introduced after various monomers are polymerized to form a principal chain, and a method in which compounds having phenyl group are grafted into a side chain, etc. As substituents for phenyl group, well-known conventional substituents that can substitute a hydrogen atom of the phenyl group may be used. For example, alkyl groups, etc. may be mentioned as examples. As method for introducing nitrile groups into the thermoplastic resin (B), similar methods for introducing phenyl groups may be adopted.

The thermoplastic resin (B) is preferably of two or more components copolymers comprising repeating unit (nitrile unit) induced from unsaturated nitrile compounds, and repeating unit (styrene based unit) induced from styrene based compounds. For example, acrylonitrile styrene based copolymers may preferably be used.

As unsaturated nitrile compounds, arbitrary compounds having cyano groups and reactive double bonds may be mentioned. For example, acrylonitrile, α-substituted unsaturated nitriles, such as methacrylonitrile, nitrile compounds having has α- and β-disubstituted olefin based unsaturated bond, such as fumaronitrile may be mentioned.

As styrene based compound, arbitrary compounds having a phenyl group and a reactive double bond may be mentioned. For example, there may be mentioned, non-substituted or substituted styrene based compounds, such as styrene, vinyl-toluene, methoxy styrene, and chloro styrene; α-substituted styrene based compounds, such as α-methyl styrene.

A content of a nitrile unit in the thermoplastic resin (B) is not especially limited, and it is approximately 10 to 70% by weight on the basis of all repeating units, preferably 20 to 60% by weight, and more preferably 20 to 50% by weight. It is further preferably 20 to 40% by weight, and still further preferably 20 to 30% by weight. A content of a styrene based unit is approximately 30 to 80% by weight, preferably 40 to 80% by weight, and more preferably 50 to 80% by weight. It is especially 60 to 80% by weight, and further preferably 70 to 80% by weight.

The thermoplastic resin (B) may comprise repeating units of the above-mentioned nitrites, and styrene based repeating units, and it may be formed only of these units. And in addition to the above constitution, other vinyl based monomeric repeating units may be included at a percentage of 50 mole % or less. As other vinyl based monomers, compounds, repeating units of olefins, repeating units of maleimide and substituted maleimides, etc. may be mentioned, which were illustrated in the case of thermoplastic resin (A). As the thermoplastic resins (B), AS resins, ABS resins, ASA resins, etc. may be mentioned.

A weight average molecular weight of the thermoplastic resin (B) is not especially limited, and it is approximately $1 \times 10^3$ to $5 \times 10^6$. It is preferably $1 \times 10^4$ or more, and $5 \times 10^5$ or less.

A compounding ratio of the thermoplastic resin (A) and the thermoplastic resin (B) is adjusted depending on a retardation required for a protective film. In the above-mentioned compounding ratio, in general, a content of the thermoplastic resin (A) is preferably 50 to 95% by weight in total amount of a resin in a film, more preferably 60 to 95% by weight, and still more preferably 65 to 90% by weight. A content of the thermoplastic resin (B) is preferably 5 to 50% by weight in total amount of the resin in the film, more preferably 5 to 40% by weight, and still more preferably 10 to 35% by weight. The thermoplastic resin (A) and the thermoplastic resin (B) are mixed using a method in which these are kneaded in thermally molten state. The thermoplastic resin (A) and the thermoplastic resin (B) may be formed into a solution, and the solution may be formed into a film by a flow casting method or the like.

The material for forming the protective film may be a low-photoelastic-coefficient material such as norbornene resins. Protective films containing norbornene resins can be hard to cause retardation even if they are stressed by a dimensional change, and retardation generated by optical distortion of the protective film when adhere to a polarizer or a brightness enhancement film can be restrained. As norbornene resins, thermoplastic saturated norbornene resins are preferred. Thermoplastic saturated norbornene resins have a cyclo-olefin as main skeleton and have substantially no carbon-carbon double bond. Examples of such thermoplastic saturated norbornene resins include Zeonex® and Zeonor® manufactured by Nippon Zeon Co., Ltd. and Arton manufactured by JSR Corporation.

The protective film may be a stretched film. In general, film materials can have improved strength and mechanical toughness after they are stretched. However, many materials can generate retardation by stretching and are not useful for the protective film for the polarizer. A transparent film comprising a mixture of thermoplastic resins (A) and (B) or a norbornene resin as a main component can satisfy the above requirements of the in-plane retardation Re and the thickness-direction retardation Rth, even if it is stretched. Stretching treatment may be performed with uniaxial stretching or biaxial stretching. Biaxially stretched films are particularly preferred.

Materials for forming the protective film other than the above, which is excellent in transparency, mechanical strength, thermal stability, water-blocking ability, isotropy, or the like, is preferably For example, polyester type polymers, such as polyethylene terephthalate and polyethylenenaphthalate; cellulose type polymers, such as diacetyl cellulose and triacetyl cellulose; acrylics type polymer, such as poly methylmethacrylate; styrene type polymers, such as polystyrene and acrylonitrile-styrene copolymer (AS resin); polycarbonate type polymer may be mentioned. Besides, as examples of the polymer forming a protective film, polyolefin type polymers, such as polyethylene, polypropylene, polyolefin that has cyclo-type or norbornene structure, ethylene-propylene copolymer; vinyl chloride type polymer; amide type polymers, such as nylon and aromatic polyamide; imide type polymers; sulfone type polymers; polyether sulfone type polymers; polyether-ether ketone type polymers; poly phenylene sulfide type polymers; vinyl alcohol type polymer; vinylidene chloride type polymers; vinyl butyral type polymers; allylate type polymers; polyoxymethylene type polymers; epoxy type polymers; or blend polymers of the above-mentioned polymers may be mentioned. The protective film is formed as cured resin layer of heat curing type or ultraviolet curing type, such as acrylics type, urethane type, acrylics urethane type and epoxy type and silicone type.

As the opposite side of the polarizing-adhering surface above-mentioned protective film, a film with a hard coat layer and various processing aiming for antireflection, sticking prevention and diffusion or anti glare may be used.

A hard coat processing is applied for the purpose of protecting the surface of the polarizing plate from damage, and this hard coat film may be formed by a method in which, for example, a curable coated film with excellent hardness, slide property etc. is added on the surface of the protective film using suitable ultraviolet curable type resins, such as acrylic type and silicone type resins. Antireflection processing is applied for the purpose of antireflection of outdoor daylight on the surface of a polarizing plate and it may be prepared by forming an antireflection film according to the conventional method etc. Besides, a sticking prevention processing is applied for the purpose of adherence prevention with adjoining layer.

In addition, an anti glare processing is applied in order to prevent a disadvantage that outdoor daylight reflects on the surface of a polarizing plate to disturb visual recognition of transmitting light through the polarizing plate, and the processing may be applied, for example, by giving a fine concavo-convex structure to a surface of the protective film using, for example, a suitable method, such as rough surfacing treatment method by sandblasting or embossing and a method of combining transparent fine particle. As a fine particle combined in order to form a fine concavo-convex structure on the above-mentioned surface, transparent fine particles whose average particle size is 0.5 to 50 μm, for example, such as inorganic type fine particles that may have conductivity comprising silica, alumina, titania, zirconia, tin oxides, indium oxides, cadmium oxides, antimony oxides, etc., and organic type fine particles comprising cross-linked of non-cross-linked polymers may be used. When forming fine concavo-convex structure on the surface, the amount of fine particle used is usually about 2 to 50 weight parts to the transparent resin 100 weight parts that forms the fine concavo-convex structure on the surface, and preferably 5 to 25 weight parts. An anti glare layer may serve as a diffusion layer (viewing angle expanding function etc.) for diffusing transmitting light through the polarizing plate and expanding a viewing angle etc.

In addition, the above-mentioned antireflection layer, sticking prevention layer, diffusion layer, anti glare layer, etc. may be built in the protective film itself, and also they may be prepared as an optical layer different from the protective layer.

Adhering between the polarizer and the protective film may be performed using isocyanate-based adhesive, polyvinyl alcohol-based adhesive, gelatin-based adhesive, vinyl-latex-based adhesive, aqueous polyester, or the like. In particular, the polyvinyl-alcohol-based adhesive is preferred. The adhesive may contain a crosslinking agent for improving durability. The polyvinyl alcohol-based adhesive may contain such a crosslinking agent as a metal salt, glyoxal, an alcohol-based solvent, chitosan, chitin, and melamine. The process of adhering between the polarizer and the protective film is performed to attach them with the adhesive and drying them at a temperature of about 30 to 90° C. for 1 to 5 minutes. After the process, the polarizing plate is obtained.

The brightness enhancement film may be a polarization converting element having the function of dividing emitted light from a light source (a backlight) into transmitted polarized light and reflected polarized light or scattered polarized light. Such a brightness enhancement film can improve the emission efficiency of linearly polarized light by using the reflected polarized light or the scattered polarized light as returning light from a backlight.

Examples of the brightness enhancement film include anisotropic reflection polarizers. For example, the anisotropic reflection polarizer may be an anisotropic multilayered thin film capable of transmitting linearly polarized light in one direction of vibration and reflecting linearly polarized light that in another direction of vibration. For example, the anisotropic multilayered thin film may be DBEF manufactured by 3M (for example, see JP-A No. 04-268505). Examples of the anisotropic reflection polarizer also include a composite of a cholesteric liquid crystal layer and a quarter wavelength plate. Such a composite may be PCF manufactured by Nitto Denko Corporation (for example, see JP-A No. 11-231130). Examples of the anisotropic reflection polarizer also include a reflective grid polarizer. Examples of the reflective grid polarizer include a metal reflective grid polarizer that is produced by fine metal-working and can produce reflected polarized light even in the visible light range (for example, see U.S. Pat. No. 6,288,840) and a product produced by stretching a polymer containing fine metal particles in its matrix (for example, see JP-A No. 08-184701).

Examples of the brightness enhancement film also include anisotropic scattering polarizers. For example, the anisotropic scattering polarizer may be DRP manufactured by 3M (see U.S. Pat. No. 5,825,543).

Examples of the brightness enhancement film also include polarizing elements that can achieve polarization conversion by a single pass. For example, such an element may use Smectic C* (for example, see JP-A No. 2001-201635). The brightness enhancement film may also use an anisotropic diffraction grating.

Any adhesive may be used for adhering between the polarizing plate and the brightness enhancement film. For example, the adhesive may be properly selected and used from adhesives based on polymers such as acrylic polymers, silicone polymers, polyesters, polyurethanes, polyamides, polyvinyl ethers, vinyl acetate/vinyl chloride copolymers, modified polyolefins, epoxy polymers, fluoropolymers, and rubber polymers such as natural rubbers and synthetic rubbers. In particular, adhesives having good optical transparency and good weather resistance, and heat resistance and showing suitable adhesive properties such as suitable wettability, cohesiveness and adhesion are preferably used.

The adhesive may contain a crosslinking agent depending on the base polymer. The adhesive may also contain additives such as natural or synthetic resins, specifically tackifier resins, fillers comprising glass fibers, glass beads, or metal powder or any other inorganic powder, pigments, coloring agents, and antioxidants. The adhesive may also contain fine particles so as to form an adhesive layer having light diffusing ability.

The adhesive is generally used in the form of an adhesive solution containing a dissolved or dispersed base polymer or components thereof at a solids concentration of about 10 to 50% by weight. The solvent may be properly selected and used from organic solvents such as toluene and ethyl acetate and water depending on the type of the adhesive.

The above-mentioned polarizing plate may be used as elliptically polarizing plate or circularly polarizing plate on which the retardation plate is laminated. A description of the above-mentioned elliptically polarizing plate or circularly polarizing plate will be made in the following paragraph. These polarizing plates change linearly polarized light into elliptically polarized light or circularly polarized light, elliptically polarized light or circularly polarized light into linearly polarized light or change the polarization direction of linearly polarization by a function of the retardation plate. As a retardation plate that changes circularly polarized light into linearly polarized light or linearly polarized light into circularly polarized light, what is called a quarter wavelength plate (also called λ/4 plate) is used. Usually, half-wavelength plate (also called λ/2 plate) is used, when changing the polarization direction of linearly polarized light.

Elliptically polarizing plate is effectively used to give a monochrome display without above-mentioned coloring by compensating (preventing) coloring (blue or yellow color) produced by birefringence of a liquid crystal layer of a super twisted nematic (STN) type liquid crystal display. Furthermore, a polarizing plate in which three-dimensional refractive index is controlled may also preferably compensate (prevent) coloring produced when a screen of a liquid crystal display is viewed from an oblique direction. Circularly polarizing plate is effectively used, for example, when adjusting a color tone of a picture of a reflection type liquid crystal display that provides a colored picture, and it also has function of antireflection. For example, a retardation plate may be used that compensates coloring and viewing angle, etc. caused by birefringence of various wavelength plates or liquid crystal layers etc. Besides, optical characteristics, such as retardation, may be controlled using laminated layer with two or more sorts of retardation plates having suitable retardation value according to each purpose.

A retardation plate may be a retardation plate that has a proper retardation according to the purposes of use, such as various kinds of wavelength plates and plates aiming at compensation of coloring by birefringence of a liquid crystal layer and of visual angle, etc., and may be a retardation plate in which two or more sorts of retardation plates is laminated so that optical properties, such as retardation, may be controlled. Any of the above specified plates may be used as the retardation plate, and a homeotropic alignment liquid crystal film may also be used alone or in combination with any other film to form the retardation plate.

The retardation plate may be used as a viewing angle compensating film to form a wide viewing angle polarizing plate together with the polarizing plate laminated therewith. A viewing angle compensation film is a film for extending viewing angle so that a picture may look comparatively clearly, even when it is viewed from an oblique direction not from vertical direction to a screen.

As such a viewing angle compensation retardation plate, in addition, a film having birefringence property that is processed by biaxially stretching or orthogonal biaxial stretching and a biaxially stretched film as inclined orientation film etc. may be used. As inclined orientation film, for example, a film obtained using a method in which a heat shrinking film is adhered to a polymer film, and then the combined film is heated and stretched or shrunk under a condition of being influenced by a shrinking force, or a film that is oriented in oblique direction may be mentioned. The viewing angle compensation film is suitably combined for the purpose of prevention of coloring caused by change of visible angle based on retardation by liquid crystal cell etc. and of expansion of viewing angle with good visibility.

Besides, a compensation plate in which an optical anisotropy layer consisting of an alignment layer of liquid crystal polymer, especially consisting of an inclined alignment layer of discotic liquid crystal polymer is supported with triacetyl cellulose film may preferably be used from a viewpoint of attaining a wide viewing angle with good visibility.

Although other optical layers laminated used in practical are especially no limitation, one layer or two layers or more of optical layers, which may be used for formation of a liquid crystal display etc., such as a reflector, a transflective plate. Especially preferable polarizing plates are; a reflection type polarizing plate or a transflective type polarizing plate in which a reflector or a transflective reflector is further laminated onto the elliptically polarizing plate or a circular polarizing plate.

A reflective layer is prepared on a polarizing plate to give a reflection type polarizing plate, and this type of plate is used for a liquid crystal display in which an incident light from a view side (display side) is reflected to give a display. This type of plate does not require built-in light sources, such as a backlight, but has an advantage that a liquid crystal display may easily be made thinner. A reflection type polarizing plate may be formed using suitable methods, such as a method in which a reflective layer of metal etc. is, if required, attached to one side of a polarizing plate through a transparent protective layer etc.

As an example of a reflection type polarizing plate, a plate may be mentioned on which, if required, a reflective layer is formed using a method of attaching a foil and vapor deposition film of reflective metals, such as aluminum, to one side of a matte treated protective film. Moreover, a different type of plate with a fine concavo-convex structure on the surface obtained by mixing fine particle into the above-mentioned protective film, on which a reflective layer of concavo-convex structure is prepared, may be mentioned. The reflective layer that has the above-mentioned fine concavo-convex structure diffuses incident light by random reflection to prevent directivity and glaring appearance, and has an advantage of controlling unevenness of light and darkness etc. Moreover, the protective film containing the fine particle has an advantage that unevenness of light and darkness may be controlled more effectively, as a result that an incident light and its reflected light that is transmitted through the film are diffused. A reflective layer with fine concavo-convex structure on the surface effected by a surface fine concavo-convex structure of a protective film may be formed by a method of attaching a metal to the surface of a transparent protective layer directly using, for example, suitable methods of a vacuum evaporation method, such as a vacuum deposition method, an ion plating method, and a sputtering method, and a plating method etc.

Instead of a method in which a reflection plate is directly given to the protective film of the above-mentioned polarizing plate, a reflection plate may also be used as a reflective sheet constituted by preparing a reflective layer on the suitable film for the transparent film. In addition, since a reflective layer is usually made of metal, it is desirable that the reflective side is covered with a protective film or a polarizing plate etc. when used, from a viewpoint of preventing deterioration in reflectance by oxidation, of maintaining an initial reflectance for a long period of time and of avoiding preparation of a protective layer separately etc.

In addition, a transflective type polarizing plate may be obtained by preparing the above-mentioned reflective layer as a transflective type reflective layer, such as a half-mirror etc. that reflects and transmits light. A transflective type polarizing plate is usually prepared in the backside of a liquid crystal cell and it may form a liquid crystal display unit of a type in which a picture is displayed by an incident light reflected from a view side (display side) when used in a comparatively well-lighted atmosphere. And this unit displays a picture, in a comparatively dark atmosphere, using embedded type light sources, such as a back light built in backside of a transflective type polarizing plate. That is, the transflective type polarizing plate is useful to obtain of a liquid crystal display of the type that saves energy of light sources, such as a back light, in a well-lighted atmosphere, and can be used with a built-in light source if needed in a comparatively dark atmosphere etc.

Moreover, the polarizing plate may consist of multi-layered film of laminated layers of a polarizing plate and two of more of optical layers as the above-mentioned separated type polarizing plate. Therefore, a polarizing plate may be a reflection type elliptically polarizing plate or a semi-transmission type elliptically polarizing plate, etc. in which the above-mentioned reflection type polarizing plate or a transflective type polarizing plate is combined with above described retardation plate respectively.

The elliptically polarizing plate or the reflection type elliptically polarizing plate was laminate of the polarizing plate or the reflection type polarizing plate and the retardation plate with arbitrary combination. Although the elliptically polarizing plate or the like is separately laminated so as to form a combination of (reflection type) polarizing plate and retardation plate sequentially in manufacturing process of a liquid crystal display etc., an optical film, such as the elliptically polarizing plate or the like, in a form of being laminated beforehand has an outstanding advantage that it has excellent stability in quality and assembly workability, etc., and thus manufacturing processes ability of a liquid crystal display etc. may be raised.

The high-brightness polarizing plate of the invention may further comprise an adhesive layer. The adhesive layer may be used for adhering to liquid crystal cells and may also be used for lamination of optical layers. When the high-brightness polarizing plate is adhered, the optical axes may be set at any proper angle(s) depending on the desired retardation properties.

Any adhesive may be used to form the adhesive layer. Examples of the adhesive may include those as specified above. The adhesive layer may be formed in the same manner.

An adhesive layer may also be prepared on one side or both sides of the polarizing plate or the optical film as a layer in which pressure sensitive adhesives with different composition or different kind etc. are laminated together. Moreover, when adhesive layers are prepared on both sides, adhesive layers that have different compositions, different kinds or thickness, etc. may also be used on front side and backside of the polarizing plate or the optical film. Thickness of an adhesive layer may be suitably determined depending on a purpose of usage or adhesive strength, etc., and generally is 1 to 500 μm, preferably 5 to 200 μm, and more preferably 10 to 100 μm.

A temporary separator is attached to an exposed side of an adhesive layer to prevent contamination etc., until it is practically used. Thereby, it can be prevented that foreign matter contacts adhesive layer in usual handling. As a separator, without taking the above-mentioned thickness conditions into consideration, for example, suitable conventional sheet materials that is coated, if necessary, with release agents, such as silicone type, long chain alkyl type, fluorine type release agents, and molybdenum sulfide may be used. As a suitable sheet material, plastics films, rubber sheets, papers, cloths, no woven fabrics, nets, foamed sheets and metallic foils or laminated sheets thereof may be used.

In addition, in the present invention, ultraviolet absorbing property may be given to the above-mentioned each layer, such as the polarizer for the polarizing plate, the protective film and the optical film etc. and the adhesive layer, using a method of adding UV absorbents, such as salicylic acid ester type compounds, benzophenol type compounds, benzotriazol type compounds, cyano acrylate type compounds, and nickel complex salt type compounds.

A diffusion plate may also be prepared between brightness enhancement film and the above described reflective layer, etc. A polarized light reflected by the brightness enhancement film goes to the above described reflective layer etc., and the diffusion plate installed diffuses passing light uniformly and changes the light state into depolarization at the same time. That is, the diffusion plate returns polarized light to natural light state. Steps are repeated where light, in the unpolarized state, i.e., natural light state, reflects through reflective layer and the like, and again goes into brightness enhancement film through diffusion plate toward reflective layer and the like. Diffusion plate that returns polarized light to the natural light state is installed between brightness enhancement film and the above described reflective layer, and the like, in this way, and thus a uniform and bright screen may be provided while maintaining brightness of display screen, and simultaneously controlling non-uniformity of brightness of the display screen. By preparing such diffusion plate, it is considered that number of repetition times of reflection of a first incident light increases with sufficient degree to provide uniform and bright display screen conjointly with diffusion function of the diffusion plate.

The high-brightness polarizing plate of the present invention may be preferably used for manufacturing various equipments, such as liquid crystal display, etc. Assembling of a liquid crystal display may be carried out according to conventional methods. That is, a liquid crystal display is generally manufactured by suitably assembling several parts such as a liquid crystal cell, high-brightness polarizing plate and, if necessity, lighting system, and by incorporating driving circuit. In the present invention, except that the high-brightness polarizing plate by the present invention is used, there is especially no limitation to use any conventional methods. Also any liquid crystal cell of arbitrary type, such as TN type, and STN type, π type may be used.

Suitable liquid crystal displays, such as liquid crystal display with which the above-mentioned polarizing plate or the optical film has been located at one side or both sides of the liquid crystal cell, and with which a backlight or a reflector is used for a lighting system may be manufactured. In this case, the optical film by the present invention may be installed in one side or both sides of the liquid crystal cell. When installing the polarizing plates or the optical films in both sides, they may be of the same type or of different type. Furthermore, in assembling a liquid crystal display, suitable parts, such as diffusion plate, anti-glare layer, antireflection film, protective plate, prism array, lens array sheet, optical diffusion plate, and backlight, may be installed in suitable position in one layer or two or more layers. The backlight may use a diffusing plate, a prism sheet, a light guide plate, a cold-cathode fluorescent tube house, and the like. The arrangement order and the number regarding to the diffusing plate and the prism sheet may be not limited.

Subsequently, organic electro luminescence equipment (organic EL display) will be explained. Generally, in organic EL display, a transparent electrode, an organic luminescence layer and a metal electrode are laminated on a transparent substrate in an order configuring an illuminant (organic electro luminescence illuminant). Here, an organic luminescence layer is a laminated material of various organic thin films, and much compositions with various combination are known, for example, a laminated material of hole injection layer comprising triphenylamine derivatives etc., a luminescence layer comprising fluorescent organic solids, such as anthracene; a laminated material of electronic injection layer comprising such a luminescence layer and perylene derivatives, etc.; laminated material of these hole injection layers, luminescence layer, and electronic injection layer etc.

An organic EL display emits light based on a principle that positive hole and electron are injected into an organic luminescence layer by impressing voltage between a transparent electrode and a metal electrode, the energy produced by recombination of these positive holes and electrons excites fluorescent substance, and subsequently light is emitted when excited fluorescent substance returns to ground state. A mechanism called recombination which takes place in a intermediate process is the same as a mechanism in common diodes, and, as is expected, there is a strong non-linear relationship between electric current and luminescence strength accompanied by rectification nature to applied voltage.

In an organic EL display, in order to take out luminescence in an organic luminescence layer, at least one electrode must be transparent. The transparent electrode usually formed with transparent electric conductor, such as indium tin oxide (ITO), is used as an anode. On the other hand, in order to make electronic injection easier and to increase luminescence efficiency, it is important that a substance with small work function is used for cathode, and metal electrodes, such as Mg—Ag and Al—Li, are usually used.

In organic EL display of such a configuration, an organic luminescence layer is formed by a very thin film about 10 nm in thickness. For this reason, light is transmitted nearly completely through organic luminescence layer as through transparent electrode. Consequently, since the light that enters, when light is not emitted, as incident light from a surface of a transparent substrate and is transmitted through a transparent electrode and an organic luminescence layer and then is reflected by a metal electrode, appears in front surface side of the transparent substrate again, a display side of the organic EL display looks like mirror if viewed from outside.

In an organic EL display containing an organic electro luminescence illuminant equipped with a transparent electrode on a surface side of an organic luminescence layer that emits light by impression of voltage, and at the same time equipped with a metal electrode on a back side of organic luminescence layer, a retardation plate may be installed between these transparent electrodes and a polarizing plate, while preparing the polarizing plate on the surface side of the transparent electrode.

Since the retardation plate and the polarizing plate have function polarizing the light that has entered as incident light from outside and has been reflected by the metal electrode, they have an effect of making the mirror surface of metal electrode not visible from outside by the polarization action. If a retardation plate is configured with a quarter wavelength plate and the angle between the two polarization directions of the polarizing plate and the retardation plate is adjusted to π/4, the mirror surface of the metal electrode may be completely covered.

This means that only linearly polarized light component of the external light that enters as incident light into this organic EL display is transmitted with the work of polarizing plate. This linearly polarized light generally gives an elliptically polarized light by the retardation plate, and especially the retardation plate is a quarter wavelength plate, and moreover when the angle between the two polarization directions of the polarizing plate and the retardation plate is adjusted to π/4, it gives a circularly polarized light.

This circularly polarized light is transmitted through the transparent substrate, the transparent electrode and the organic thin film, and is reflected by the metal electrode, and then is transmitted through the organic thin film, the transparent electrode and the transparent substrate again, and is turned into a linearly polarized light again with the retardation plate. And since this linearly polarized light lies at right angles to the polarization direction of the polarizing plate, it cannot be transmitted through the polarizing plate. As the result, mirror surface of the metal electrode may be completely covered.

EXAMPLES

The invention is more specifically described by means of Examples and Comparative Examples below. It should be noted that "%" means "% by weight" in each example.

(Preparation of Polarizer)

A polyvinyl alcohol raw film (Vinylon Film VF-9P75RS manufactured by Kuraray Co., Ltd.) was used which had a maximum difference of 1.2 μm between the maximum and minimum of variations in thickness in a 100 mm in-plane area. The raw film was subjected to a swelling process, in which the film was stretched at a stretch ratio of 2, while immersed in purified water at 30° C. for 120 seconds. The film was then subjected to a dyeing process, in which the film was stretched at a stretch ratio of 1.5, while immersed in a dyeing bath (an aqueous solution of iodine and potassium iodide at a ratio of 1:10 (by weight) whose concentration was adjusted so as to produce a final single-pass transmittance of 44.0%) for 50 seconds. The film was then subjected to a crosslinking process with boric acid, in which the film was stretched at a stretch ratio of 1.1, while immersed in a boric acid crosslinking bath (at 30° C. with a boric acid concentration of 5% and a potassium iodide concentration of 2%). The film was then subjected to a stretching process, in which the film was stretched at a stretch ratio of 1.8, while immersed in a stretching bath (at 60° C. with a boric acid concentration of 5% and a potassium iodide concentration of 5%). The film was then subjected to a water-washing process, in which the film was stretched such that the total stretch ratio was 6.1, while immersed in a water-washing bath (with a potassium iodide concentration of 5%) for 5 seconds. The film was then dried under control so as to have a water content of 20%. Relative to the raw film, the resulting stretched film (a polarizer) was 42% and 39% in thickness.

(Protective Film A)

One hundred parts by weight (60% by weight) of an alternating copolymer of isobutene and N-methylmaleimide (with an N-methylmaleimide content of 50% by mole and a glass transition temperature of 157° C.) and 67 parts by weight (40% by weight) of a thermoplastic styrene-acrylonitrile copolymer with an acrylonitrile content of 27% by weight and a styrene content of 73% by weight were melted and kneaded into pellets. The pellets were fed to a T-die-equipped melt extruder to obtain a 100 μm-thick raw film. The raw film was stretched at a stretching speed of 100 cm/minute, a stretch ratio of 1.45 and a stretching temperature of 162° C. in a free-end uniaxial longitudinal stretching manner and then stretched in a direction perpendicular to the first direction under the same conditions in a free-end uniaxial manner to obtain a 49 μm-thick stretched film (protective film A). The protective film A had an in-plane retardation Re of 1.1 nm and a thickness-direction retardation Rth of −2.8 nm. The in-plane retardation Re and thickness-direction retardation Rth of the protective film were calculated from the refractive index values nx, ny and nz at 590 nm measured with an automatic birefringence analyzer (Automatic Birefringence Analyzer KOBRA 21ADH manufactured by Oji Scientific Instruments).

The absolute value of the photoelastic coefficient of the protective film A was $1.9 \times 10^{-13}$ cm$^2$/dye. The photoelastic coefficient is a value determined from retardations under application of stress to the film. Specifically, the measurement of the photoelastic coefficient was performed according to the measurement method described in Memoirs of Tokyo Metropolitan Institute of Technology, Vol. 10 (1996, 12) pp. 54-56.

The protective film A was immersed in an aqueous solution of 5% sodium hydroxide at 40° C. for 2 minutes, then washed with purified water at 30° C. for 1 minute, and then dried at 100° C. for 2 minutes, and the resulting saponified film was used.

(Protective Film B)

An 80 μm-thick triacetyl cellulose film (TD-80U manufactured by Fuji Photo Film Co., Ltd.) was immersed in an aqueous solution of 5% sodium hydroxide at 40° C. for 2 minutes, then washed with purified water at 30° C. for 1 minute, and then dried at 100° C. for 2 minutes, and the resulting saponified film was used. The protective film B had an in-plane retardation Re of 3 nm and a thickness-direction retardation Rth of −60 nm.

(Brightness Enhancement Film A)

DBEF (an anisotropic multilayered thin film) manufactured by 3M was used.

(Brightness Enhancement Film B)

PCF 400 (a laminate of a cholesteric liquid crystal and a quarter wavelength plate) manufactured by Nitto Denko Corporation was used.

Example 1

The protective film A was adhered to both sides of the polarizer with a 5% aqueous solution of a mixture of 75 parts of polyvinyl alcohol (NH-18 manufactured by The Nippon Synthetic Chemical Industry Co., Ltd.) and 25 parts of glyoxal and then dried at 50° C. for 5 minutes to obtain a polarizing plate. The brightness enhancement film A and the polarizing plate were adhered together with a transparent acrylic adhesive to obtain a high-brightness polarizing plate as shown in FIG. 1. When the high-brightness polarizing plate was prepared, adhering was performed such that the absorption axis of the polarizing plate was set perpendicular to the transmission axis of the brightness enhancement film A.

Example 2

The protective film A was adhered to both sides of the polarizer with a 5% aqueous solution of a mixture of 75 parts of polyvinyl alcohol (NH-18 manufactured by The Nippon Synthetic Chemical Industry Co., Ltd.) and 25 parts of glyoxal and then dried at 50° C. for 5 minutes to obtain a polarizing plate. The brightness enhancement film A and the polarizing plate were adhered together with a transparent acrylic adhesive to obtain a high-brightness polarizing plate as shown in FIG. 2. In the high-brightness polarizing plate, adhering was performed such that the slow axis of the quarter wavelength plate of the brightness enhancement film B was inclined by 45° to the absorption axis of the polarizing plate. The quarter wavelength plate side of the brightness enhancement film B was adhered to the polarizing plate.

Comparative Example 1

A high-brightness polarizing plate was prepared using the process of Example 1 except that the protective film B was used in place of the protective film A.

Comparative Example 2

A high-brightness polarizing plate was prepared using the process of Example 2 except that the protective film B was used in place of the protective film A.

The high-brightness polarizing plates obtained in Examples and Comparative Examples were evaluated as follows. The results are shown in Table 1.

(Determination of Change in Chromaticity)

The brightness enhancement film side of each high-brightness polarizing plate was adhered to a glass plate using a laminator. The laminate was placed on a backlight such that the brightness enhancement film side faced the backlight side. The backlight was a LCD backlight for use in ThinkPad A30 manufactured by IBM. Changes in chromaticity were determined in the normal direction (0°) of the front face of the high-brightness polarizing plate and in an inclined direction (70°) with respect to the normal direction. Changes in chromaticity were measured using BM-7 manufactured by Topcon Corporation.

TABLE 1

| | 0° | | 70° | | Amount of shift | |
|---|---|---|---|---|---|---|
| | X | Y | X | Y | ΔX | ΔY |
| Example 1 | 0.3058 | 0.3033 | 0.3081 | 0.3000 | −0.0023 | +0.0033 |
| Example 2 | 0.2905 | 0.3021 | 0.3157 | 0.3311 | −0.0252 | −0.0290 |
| Comparative Example 1 | 0.3102 | 0.3097 | 0.3150 | 0.3060 | −0.0048 | +0.0037 |
| Comparative Example 2 | 0.2957 | 0.3082 | 0.3231 | 0.3396 | −0.0274 | +0.0314 |

The amount of shift was calculated from X-axis chromaticity values or Y-axis chromaticity values with respect to the front face (0°) and the inclined direction (70°). Their absolute values were used for evaluation. As a result of comparing the mount of shift between Example 1 and Comparative Example I and between Example 2 and Comparative Example 2, it is apparent that the amount of shift is significantly smaller in Examples than that in Comparative Examples.

INDUSTRIAL APPLICABILITY

The high-brightness polarizing plate of the invention comprising a laminate of a polarizing plate and a brightness enhancement film may be used alone or in combination with any other optical film to apply various types of image viewing displays such as liquid crystal displays, organic EL displays and PDPs.

The invention claimed is:

1. A high-brightness polarizing plate, comprising: a polarizing plate;
   wherein the polarizing plate comprises a polarizer and a protective film prepared on one or both sides of the polarizer, and the polarizer and the protective film are adhered with an adhesive;
   a brightness enhancement film; and an adhesive layer through which the polarizing plate and the brightness enhancement film are laminated with the protective film interposed between them, wherein
   the protective film has an in-plane retardation Re of 0 to 10 nm and a thickness-direction retardation Rth of −30 to 10 nm, wherein $Re = (nx-ny)d$ and $Rth = \{(nx+ny)/(2-nz)\} d$, wherein nx is a refractive index in an X-axis direction in which a maximum in-plane refractive index is obtained, ny is a refractive index in a Y-axis direction perpendicular to the X-axis, nz is a refractive index in a Z-axis direction which is the film thickness direction, and d is a thickness (nm) of the protective film.

2. The high-brightness polarizing plate according to claim 1, wherein the protective film contains (A) a thermoplastic resin having a substituted and/or unsubstituted imide group in side chain and (B) a thermoplastic resin having a substituted and/or unsubstituted phenyl and nitrile groups in side chain.

3. The high-brightness polarizing plate according to claim 1, wherein the protective film is a biaxially stretched film.

4. The high-brightness polarizing plate according to claim 1, wherein the polarizer is an iodine-containing polyvinyl alcohol-based film.

5. The high-brightness polarizing plate according to claim 1, wherein the brightness enhancement film is an anisotropic reflection polarizer.

6. The high-brightness polarizing plate according to claim 5, wherein the anisotropic reflection polarizer is a composite of a cholesteric liquid crystal layer and a quarter wavelength plate.

7. The high-brightness polarizing plate according to claim 5, wherein the anisotropic reflection polarizer is an anisotropic multilayered thin film capable of transmitting linearly polarized light in one direction of vibration and reflecting linearly polarized light that in another direction of vibration.

8. The high-brightness polarizing plate according to claim 5, wherein the anisotropic reflection polarizer is a reflective grid polarizer.

9. The high-brightness polarizing plate according to claim 1, wherein the brightness enhancement film is an anisotropic scattering polarizer.

10. A high-brightness polarizing plate, comprising the high-brightness polarizing plate according to claim 1 and at least one optical film.

11. A liquid crystal panel, comprising a liquid crystal cell and the high-brightness polarizing plate according to claim 1 attached to at least one side of the liquid crystal cell.

12. A liquid crystal display, comprising the liquid crystal panel according to claim 11.

13. An image viewing display, comprising the high-brightness polarizing plate according to claim 1.

* * * * *